United States Patent
Bakalski et al.

(10) Patent No.: US 10,498,332 B2
(45) Date of Patent: Dec. 3, 2019

(54) SYSTEM AND METHOD FOR A DRIVING A RADIO FREQUENCY SWITCH

(71) Applicant: Infineon Technologies AG, Neubiberg (DE)

(72) Inventors: Winfried Bakalski, Munich (DE); Anthony Thomas, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 15/955,272

(22) Filed: Apr. 17, 2018

(65) Prior Publication Data

US 2018/0234094 A1 Aug. 16, 2018

Related U.S. Application Data

(62) Division of application No. 14/243,338, filed on Apr. 2, 2014, now Pat. No. 9,966,946.

(51) Int. Cl.
*H03K 17/56* (2006.01)
*H03K 17/687* (2006.01)
*H03K 17/693* (2006.01)

(52) U.S. Cl.
CPC ....... *H03K 17/6872* (2013.01); *H03K 17/693* (2013.01); *Y10T 307/747* (2015.04)

(58) Field of Classification Search
CPC ........... H02J 9/061; H03K 17/56; H03K 7/66; H03K 7/68; H03K 7/6872
See application file for complete search history.

(56) References Cited

U.S. PATENT DOCUMENTS

| 6,396,325 B2 * | 5/2002 | Goodell ........... H03K 17/04123 327/308 |
| 8,400,205 B2 | 3/2013 | Foroudi |
| 9,124,265 B2 * | 9/2015 | Dykstra ............... H03K 17/005 |
| 9,515,645 B2 | 12/2016 | Bakalski et al. |
| 9,966,946 B2 * | 5/2018 | Bakalski ............. H03K 17/693 |
| 2011/0025404 A1 | 2/2011 | Cassia |
| 2011/0050288 A1 | 3/2011 | Sagae et al. |
| 2012/0001676 A1 | 1/2012 | Iraha et al. |
| 2012/0126875 A1 | 5/2012 | Teraguchi |

FOREIGN PATENT DOCUMENTS

| JP | 2011055129 A | 3/2011 |
| JP | 2012044637 A | 3/2012 |
| JP | 2012114608 A | 6/2012 |
| KR | 20120051035 A | 5/2012 |

* cited by examiner

*Primary Examiner* — Hai L Nguyen
(74) *Attorney, Agent, or Firm* — Slater Matsil, LLP

(57) ABSTRACT

In accordance with an embodiment, a radio frequency (RF) switching circuit includes a plurality of series connected RF switch cells having a load path and a control node, and a switch driver coupled to the control node. Each of the plurality of series connected RF switch cells includes a switch transistor and a gate resistor having a first end coupled to a gate of the switch transistor and a second end coupled to the control node. The switch driver includes a variable output impedance that varies with a voltage of the control node.

17 Claims, 8 Drawing Sheets

SYSTEM AND METHOD FOR A DRIVING A RADIO FREQUENCY SWITCH

This application is a divisional of U.S. patent application Ser. No. 14/243,338, entitled "System and Method for a Driving a Radio Frequency Switch," filed Apr. 2, 2014, now U.S. Pat. No. 9,966,946, which issued May 8, 2018; which application is incorporated herein by reference in its entirety.

TECHNICAL FIELD

The present disclosure relates generally to an electronic device, and more particularly to a system and method for driving a radio frequency (RF) switch.

BACKGROUND

RF switches are used in a variety of RF circuits to implement various functions. For instance, an RF system using different signaling methods over different frequencies may be implemented by using a network of antenna switches to select from between different types of RF front-end circuits. One example of such a circuit is a multi-standard cellular telephone that can make calls using different standards such as code division multiple access (CDMA) or Global System for Mobile Communications (GSM). By using an RF switch, an RF front end circuit optimized for CDMA communication may be used for CDMA calls, while and RF front end circuit optimized for GSM communication may be used for GSM calls. In addition, RF switches may be used to implement adjustable matching networks for antennas and power amplifiers, and to provide adjusting tuning for high frequency filters by switching in and out and/or bypassing passive matching and tuning elements.

As RF components are becoming more integrated in fine geometry integrated circuit processes, there are number of technical challenges with respect to fabricating RF switches that have good high frequency performance. One such challenge is handling large voltage swings that may occur during the course of a signal transmission. In some cases, these voltage swings may exceed the breakdown voltages of the particular semiconductor process technology being used. One way in which this challenge is addressed is by stacking multiple devices and/or by using physically larger devices that may better withstand higher voltages. Another challenge to integrating RF switches involves managing the parasitic environment of the RF switch itself, as large devices used to withstand higher voltages may be prone to higher parasitic capacitances that may attenuate and/or degrade an RF signal.

SUMMARY OF THE INVENTION

In accordance with an embodiment, a radio frequency (RF) switching circuit includes a plurality of series connected RF switch cells having a load path and a control node, and a switch driver coupled to the control node. Each of the plurality of series connected RF switch cells includes a switch transistor and a gate resistor having a first end coupled to a gate of the switch transistor and a second end coupled to the control node. The switch driver includes a variable output impedance that varies with a voltage of the control node.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context: a system and method for driving a radio frequency (RF) switch. The invention may also be applied to other systems and applications including other circuits that utilize switches for high frequency applications such as wireless and wireline communication systems, radar systems, and in circuits such as oscillators, receive/transmit switches, attenuators, power amplifier bypass circuits, RF matching and RF filter switching in general.

In embodiments of the present invention, capacitive parasitics of RF switching circuits are reduced by driving the gates of the transistors with the RF switch with an adaptive impedance. In one example, the transistors of the RF switch are driven with a low impedance when the state of the switch is in transition, and are driven with a high impedance when the state of the RF switch is in a settled state (i.e. on or off). By driving the transistors of the RF switch with a low impedance during a transition, a fast transition may be ensured. By driving the transistors of the RF with a high impedance when the RF switch is in a settled state, parasitic capacitances seen at the input and output ports of the RF switch are reduced.

In a further embodiment, the RF switch is driven with a current source. When the state of the RF switch is in transition, the gates of the transistors of the RF switch are driven with a high enough current to ensure a timely state transition. When state of the RF switch is settled, the current of the current source is reduced as a result of its bias condition or is shut off using a feedback mechanism.

Figure 1A:
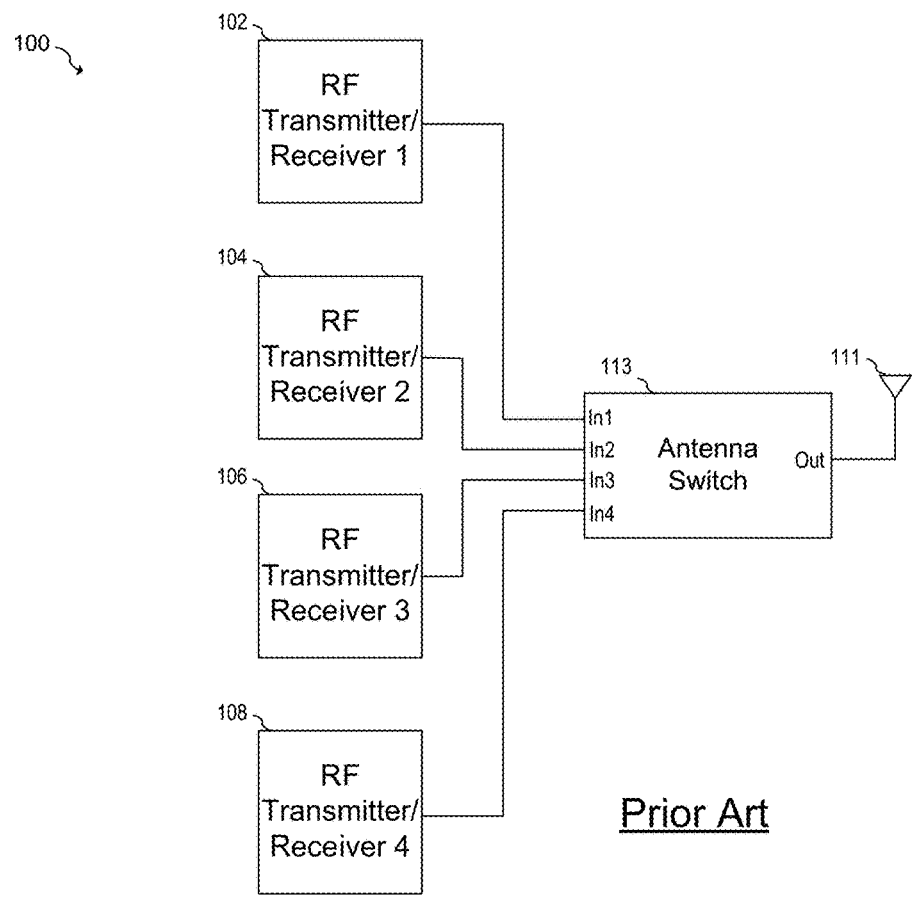
FIGS. 1a-g illustrate conventional RF switching circuits.

FIG. 1a illustrates RF system 100 that includes RF transceivers 102, 104, 106 and 108, the outputs of which are routed to antenna in via antenna switch 113. Antenna switch 113 is a single pole 4 throw SP4T RF-switch that selects from among the outputs of RF transceivers 102, 104, 106 and 108 for connection to antenna 111. The four transceiver system illustrated in FIG. 1a is just one example of many possible RF switch configurations. It should be understood that other antenna switching systems may have greater or fewer than four elements being routed to an antenna.

Figure 1B:
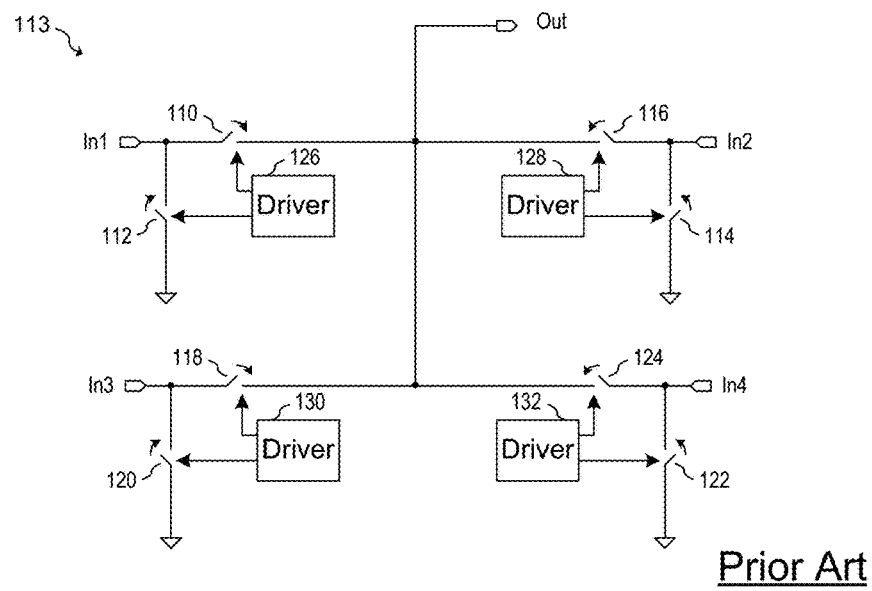

FIG. 1b illustrates a simplified schematic of antenna switch 113 that includes four RF branches, each of which includes two switches and the switch driver. For example, a first RF branch that selects first input node In1 includes series switch no and shunt switch 112. When first input node In1 is selected, driver 126 closes switch no and opens switch 112, thereby creating a conductive path between input node In1 and output node Out. On the other hand, when first input In1 is not selected, driver 126 opens switch no and closes switch 112 to disconnect input node In1 from output node Out and to shunt input node In1 to ground. Similarly, when second input In2 is selected, driver 128 closes switch 116 and opens switch 114, thereby creating a conductive path between input node In2 and output node Out. When first input In2 is not selected, driver 128 opens switch 116 and closes switch 114 to disconnect input node In2 from output node Out and to shunt input node In2 to ground. A third branch including series switch 118, shunt switch 120 and driver 130 connects and disconnects third input node In3 from output node Out, and a fourth branch including series switch 124, shunt switch 122 and driver 132 connects and disconnects fourth input node In4 from output node Out in a similar manner.

Figure 1C:
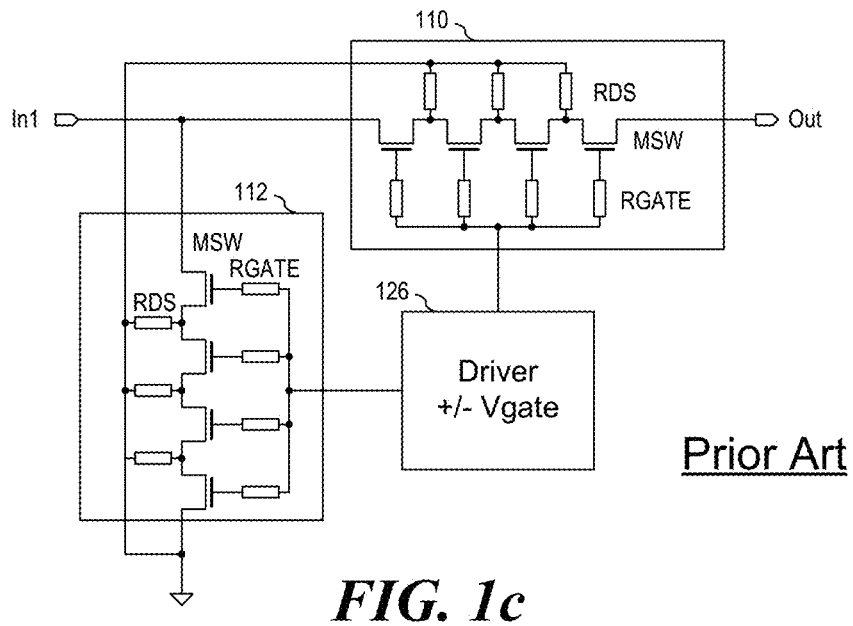

FIG. 1c illustrates a detailed view of the first RF branch that includes series switch 110, shunt switch 112 and driver 126. As shown, series switch 110 and shunt switch 112 are both implemented using a plurality of stacked transistors that are series connected, each transistor MSW of which has a series gate resistor RGATE. Such stacking is used, for example, to prevent breakdown in the presence of high RF voltage swings. As is further shown, the common source/drain nodes of the transistors MSW are coupled to ground via resistors RDS. In one example, embodiment resistors RDS may be about 400 k$\Omega$, however, other values may be used. The switch circuit may be implemented using FET transistors in a CMOS-Bulk, CMOS-SOI using think or thick film silicon on insulator (SOI), GaAs-HEMTs, or other FET transistor type technology. In some cases, PIN Diodes may also be used. As shown, transistor MSW is implemented using an NMOS device, however, transistor MSW may be implemented using a PMOS device, or other transistor type.

During operation, driver 126 provides a conductive path between input node In1 and output node Out by applying a positive voltage on the gates of transistors MSW within switch 110, while providing a negative voltage to the gates of transistors MSW within switch 112. To isolate input node In1 from output node Out, the bias voltages are reversed such that a negative voltage is applied on the gates of transistors MSW within switch 110, while a positive voltage is applied to the gates of transistors MSW within switch 112. Alternatively, transistors MSW may be activated using a positive voltage and deactivated using a negative voltage. In such embodiments, additional DC blocking capacitors (not shown), may be coupled to input node In1 or to output node Out to ensure a symmetric RF swing. Such DC blocking capacitors are utilized, for example, when a DC voltage is present on the RF line. In some embodiments where there is no DC voltage on the RF line, DC blocking capacitors are not used. For switches that do not have a negative bias on the MOS transistors, DC blocking is typically used. Such situations may occur, for example, in systems in which a the gate of a transistor is being switched between a positive voltage and ground, as is commonly the case with circuits imple-mented using GaAs technology. It should be further understood that the polarity of the activation and deactivation voltages may be different when other transistor types besides NMOS devices are used. For example, in embodiments that utilize PMOS devices, the activation voltage may be lower than the deactivation voltage.

Figure 1D:
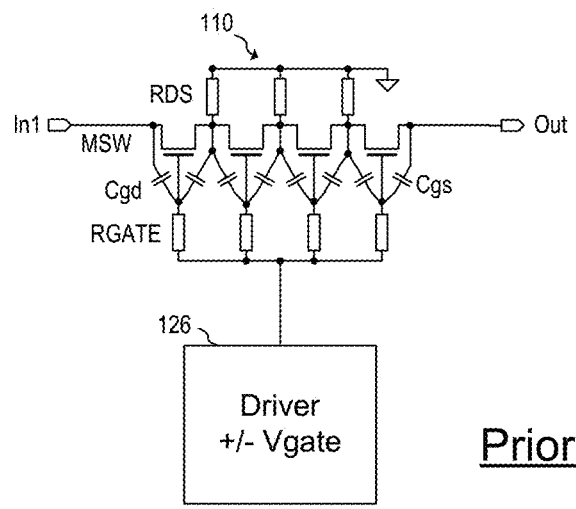

FIG. 1d is shows switch 110 and corresponding driver 126, where transistors MSW are further annotated with parasitic gate-drain capacitances Cgs and gate-source capacitances Cgs. When switch 110 is off, the series combination of parasitic capacitances Cgs and Cgd spread the RF signal present on either input node In1 or output node Out homogenously over transistors MSW. To prevent distortion of the RD signal, the resistance of RGATE and RDS are selected to be high enough to ensure that capacitances Cgs and Cgd appear as series connected capacitances to prevent parasitic loading at input node In1 and output node Out. Example values for RGATE and RDS are 400 k and 400 k respectively, however, other values may be used. Under non-ideal conditions, however, the amount of isolation afforded by resistors RGATE is limited by the parasitic capacitances associated with resistors RGATE.

Figure 1G:
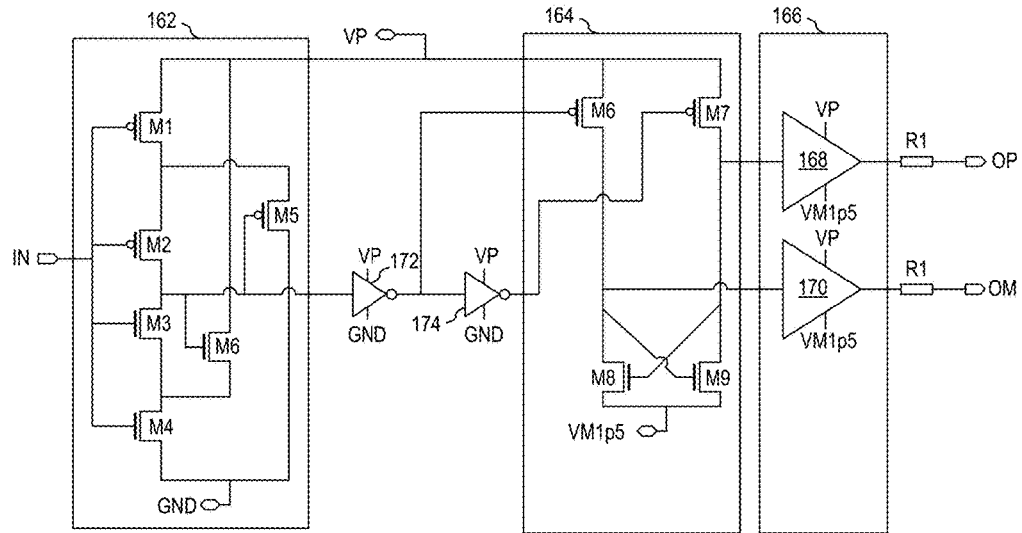
Figure 1E:
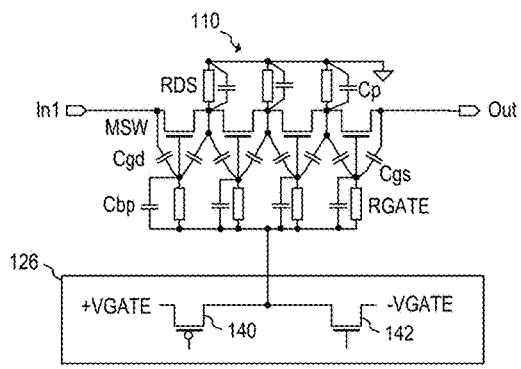

FIG. 1e illustrates switch no in which the shunt parasitic capacitance of each gate resistor RGATE is represented by capacitance Cbp and the shunt capacitance of resistor RDS represented by capacitance Cp. In addition, driver 126 is shown being implemented using PMOS switch transistor 140 to couple positive voltage +VGATE to gates of transistors MSW to turn on switch 110, and using NMOS switch transistor 142 to couple negative voltage −VGATE to the gates of transistors MSW to turn off switch 110.

Parasitic capacitances Cbp and Cp may result from non-idealities of the physical implementation of resistor RGATE. For example, when resistor RGATE and/or RDS is implemented using polysilicon disposed on top of the substrate, there will be a small amount of bypass capacitance. For example, depending on the particular resistor layout, a 400 k$\Omega$ may have a 2 fF bypass capacitance. At 1 GHz, a 2 fF capacitance corresponds to a capacitive impedance of 80 k$\Omega$, thereby lowering the total effective impedance of RGATE at 1 GHz. It should be appreciated that this is just one particular example of a physical resistor. Other embodiment resistors may have different resistor values and/or different parasitic capacitances associated with it.

When multiple transistors are stacked, the effect of the parasitic capacitance of resistor RGATE on device isolation is further exacerbated. For example, in one embodiment, 40 transistors are stacked in a series configuration in a 1.5 V device technology in order to handle RF voltage swings of about 60 V. Each of these 40 transistors has a series gate resistor associated with it. When the switch is turned off, the parallel combination of 40 gate resistors along with its associated parasitic capacitance further lowers the effective impedance that isolates the gate of the transistors when the transistors are turned off. With respect to the previous example, stacking 40 devices that each has an associated 400 k$\Omega$ resistor with 2 fF of parasitic capacitance creates an effective impedance of a 20 k$\Omega$ resistive impedance coupled in parallel with a 2 k$\Omega$ capacitive impedance, which provides very little gate isolation when the switch transistors are turned off.

Inverter type drivers, such as the implementation shown using transistors 140 and 142 provide a very low impedance to the gates of transistors MSW of switch 110. In some implementations, this low impedance may appear as an RF ground. Moreover, when a low impedance is applied to the parasitic capacitances Cgs and Cgs, the parasitic capacitance seen at input node Iin1 and output node Out is further increased due to the effect of parasitic capacitance Cbp adding in parallel. This parasitic capacitance seen at input node Iin1 and output node Out increases as more transistors are stacked and as the widths of transistors MSW are increased. Thus, the RON*Coff figure of merit commonly used for RF switches is degraded as because of Cbp lowers the impedance of the gate resistors RGATE.

Figure 1F:
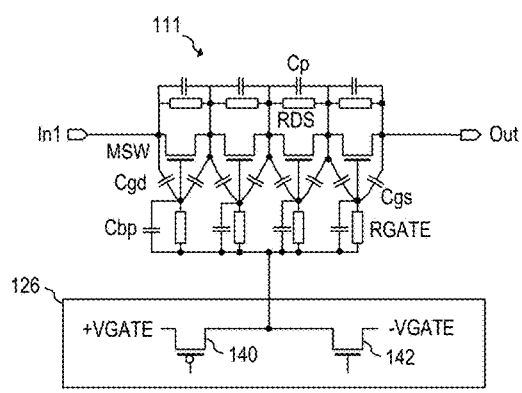

FIG. 1f illustrates switch in in resistances RDS are coupled in parallel with the source/drain connections of transistors MSW instead of being coupled from a source/drain connection to ground. The value of RDS in this case may in the range of between about 20 kΩ and about 40 kΩ, however, other value outside of this range may be used depending on the particular application and its specifications. Again the shunt parasitic capacitance of each gate resistor RGATE is represented by capacitance Cbp and the shunt capacitance of resistor RDS represented by capacitance Cp. In such a circuit, the source/drain connections are biased to ground via an extra resistor (not shown) coupled to ground or by a switch input coupled to ground, such as switch 112 in FIG. 1b, for example.

FIG. 1g illustrates a conventional RF switch driver that includes Schmitt trigger 162, level shifter 164 and output stage 166. Schmitt trigger 162, which includes PMOS transistors M1 and M2 and M3 and NMOS transistors M3 M4 and M6, provides hysteresis to input signal IN to prevent switching and unintended switching in the presence of noise. As shown, Schmitt trigger 162 is referenced to a power supply voltage VP and ground voltage GND. In one example, power supply voltage VP is about 1.5 V and ground voltage GND is about 0 V. Level shifter 164 converts the logic level output of Schmitt trigger 162 from between 0 and 1.5 V to between −1.5 V and 1.5 V. The application of a negative voltage to the switch transistors provides better off isolation in some embodiments.

Level shifter 164 includes PMOS input transistors M6 and M7 having gates coupled to the outputs of inverters 172 and 174. Cross-coupled NMOS devices M8 and M9 are coupled to negative supply voltage VM1p5 in order to pull logic levels down to a negative supply. The output of level shifter 164 is applied to buffers 168 and 170 within output stage 166. Buffers 168 and 170 may be implemented, for example, using a simple inverter structure. In some cases, resistors R1 are coupled to the output of buffers 168 and 170 in order to increase the output impedance of output stage 166.

Figure 2A:
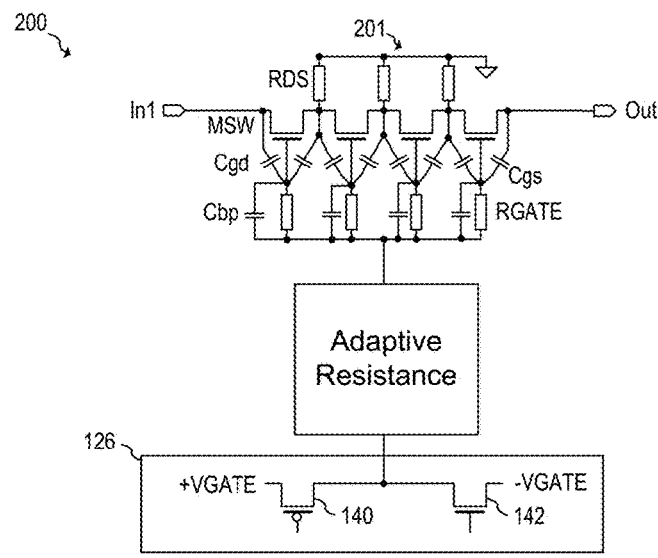
FIGS. 2a-e illustrate schematics of embodiment RF switching circuits.

FIG. 2a illustrates an RF switch system 200 according to an embodiment of the present invention. As shown, adaptive resistance 202 is coupled between inverter driver 226 and RF switch 201. In an embodiment, adaptive resistance 202 is configured to provide a low resistance during the time that the state of RF switch 201 is transitioning between and on mode and in off mode or is transitioning between in off mode and in on mode. By providing a low resistance during this transition period, the state of RF switch 201 may be changed quickly. When the state of RF switch 201 is off, however, adaptive resistance 202 is increased in order to provide isolation between inverter driver 226 and the gates of transistors MSW of RF switch 201. By providing a high impedance during the off mode of switch 201, the effect of bypass capacitances Cbp of gate resistors RGATE may be reduced in some embodiments.

Figure 2B:
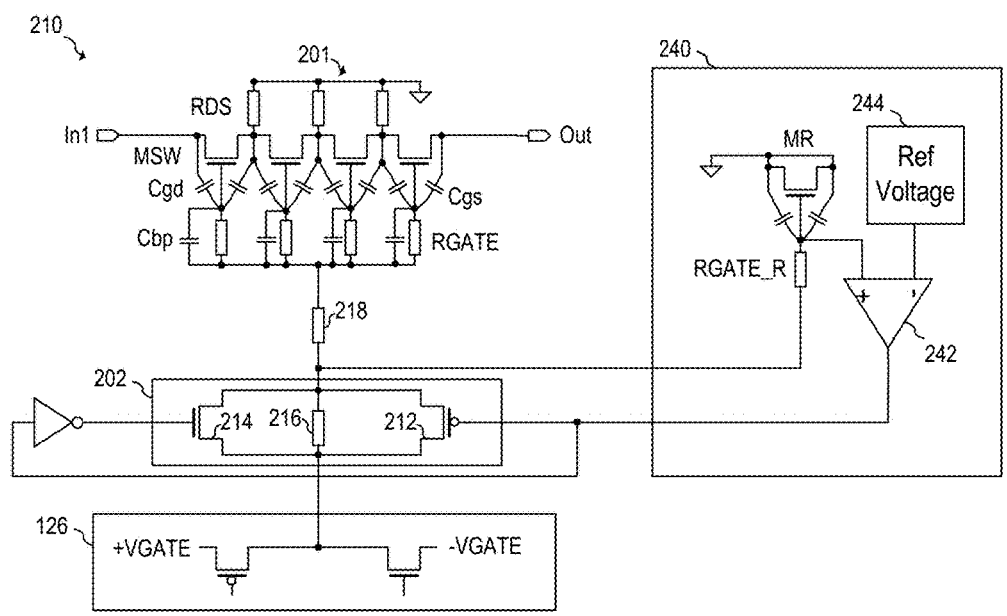

FIG. 2b illustrates RF switch and driver 210 in which adaptive resistance 202 is implemented using resistor 216 coupled in parallel with a CMOS transmission gate that includes PMOS transistor 212 and NMOS transistor 214. In an embodiment, resistor 216 is bypassed by NMOS transistor 214 and PMOS transistor 212 when the state of RF switch 201 is transitioning. When RF switch 201 is in an off state, however, transistors 212 and 214 or shut off in order to allow resistor 216 to provide additional isolation between driver 226 and RF switch 201. An additional optional series resistor 218 may be included to provide additional resistance.

In an embodiment, activation circuit 240 controls the state of adaptive resistance 202. As shown, node Vsense is applied to the gate of replica transistor MR via replica gate resistor RGATE_R. Replica transistor MR and gate resistor may be the same size as transistor MSW and resistor RGATE implemented in RF switch 201, or may be a scaled version. For example, if replica transistor is one half the width of transistor MSW, then replication resistor RGATE_R is sized to provide twice the resistance of RGATE such that the RC time constant of RGATE_R and the total gate-drain and gate source capacitances Cgd and Cgs of replica transistor MR match the RC time constant of RGATE and the total gate-drain and gate source capacitances Cgd and Cgs of switch transistor MSW. By using a replica circuit, the RC settling behavior of the RF switch in conjunction with gate resistor RGATE may be taken into account.

In an embodiment, comparator 242 compares the gate voltage of transistor MR with a reference voltage generated by reference voltage generator 244 in order to determine the state of adaptive impedance 202. In one embodiment, the reference voltage produced by reference voltage generator 244 is set to be a predetermined fraction of the settled voltage that shuts RF switch 201 off. For example, in one embodiment, a reference voltage of −1.4 V may be used for a −1.5 V shutoff voltage. Alternatively, other reference voltages may be used. It should be further appreciated that in alternative embodiments, other circuit architectures may be used for activation circuit 240. For example, a simple RC-circuit with a Schmitt-Trigger may be used to implement a unified delay time as well. Alternatively the RF voltage itself may be detected an output of the switch; as soon as the comparator "sees" a low difference it switches off the transmission gate.

Figure 2C:
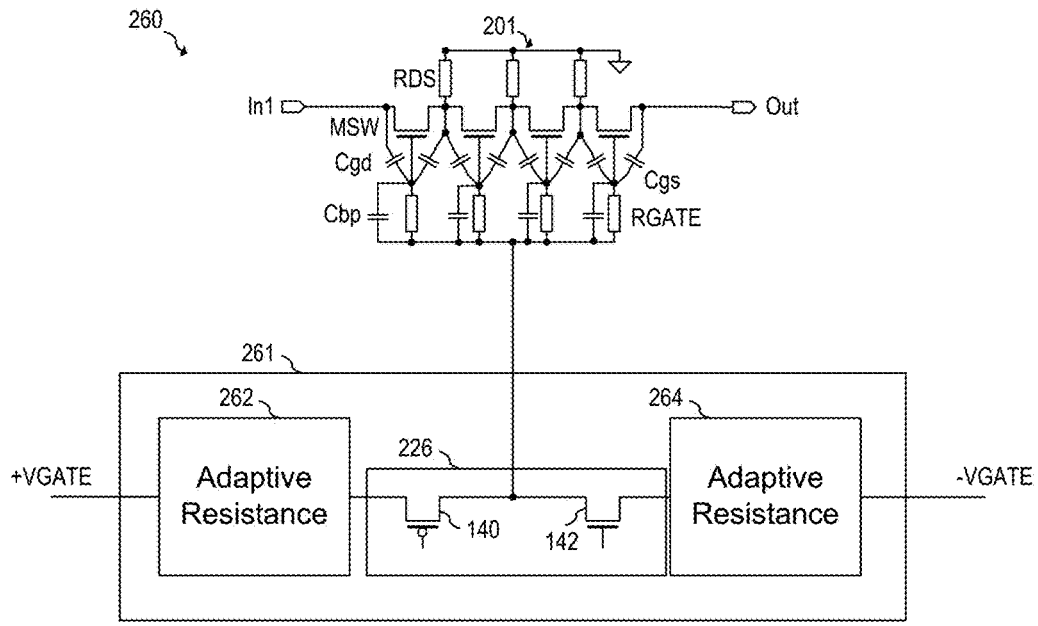

FIG. 2c illustrates a system 260 that includes RF switch 201 and driver 261 according to a further embodiment of the present invention. As shown, adaptive resistance 262 is coupled between positive drive voltage +VGATE and transistor 140 of driver 226; and adaptive resistance 264 is coupled between negative drive voltage −VGATE and transistor 142 of driver 226. In an embodiment, adaptive resistances are set to a first impedance value when the state of switch 201 is transitioning, and is set to second impedance value when switch 201 is off. In some embodiments, the first impedance value may be greater than the second impedance value.

Figure 2D:
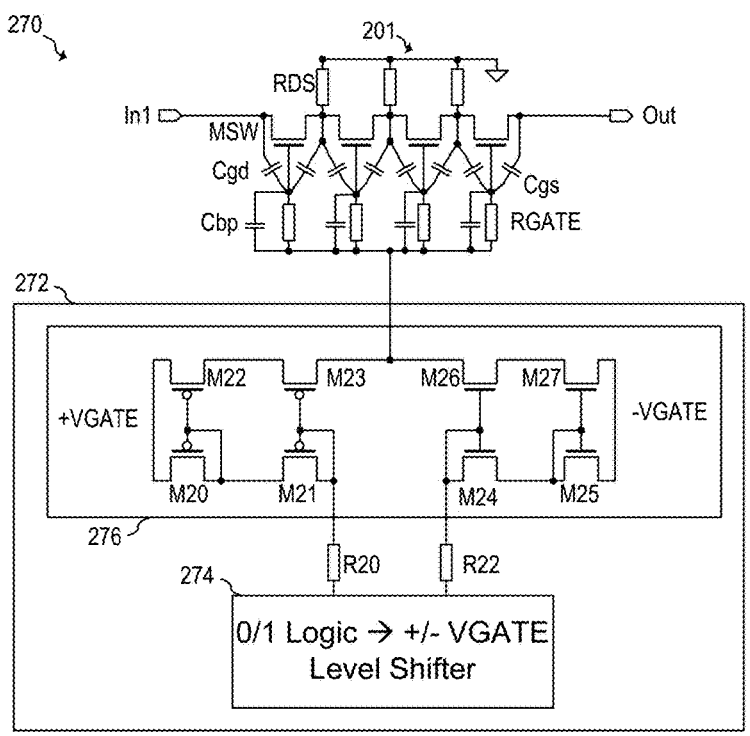

FIG. 2d illustrates a system 270 that includes RF switch 210 and driver 272 according to an alternative embodiment of the present invention. Driver 272 includes a current source circuit 276 and driving logic 274. During operation, current source 276 provides a charging current that charges the gates of transistors MSW when switch 201 transitions form an on state to an off state, and provides a discharging current the discharges the gates of transistors MSW when switch 201 transitions from the on state to the off state. In various embodiments, this current may be set to meet specified turn-on and turn-off time requirements. Once the gates of transistors MSW are fully charged or discharged, current source 276 no longer sources or sinks current as a result of the drain-source voltages of the output transistors being reduced to zero.

As shown, current source 276 includes a stacked PMOS current mirror that includes PMOS transistors M20, M21, M22 and M23. Driving logic 274 may provide a set current to PMOS transistor M21 that is mirrored to PMOS transistor M23 via PMOS transistors M20 and M22. In some embodiments, driving logic 274 may provide a voltage to optional resistor R20, which sets a current though PMOS transistors M20 and M21. Similarly, current source 276 includes a stacked NMOS current mirror that includes NMOS transistors M24, M25, M26 and M27. Driving logic 274 may further provide a set current to NMOS transistor M24 that is mirrored to NMOS transistor M26 via NMOS transistors M25 and M27. In some embodiments, driving logic 274 may provide a voltage to optional resistor R24, which sets a current though NMOS transistors M24 and M25.

In an embodiment, PMOS transistor M22 may be sized larger than PMOS transistor M20, and NMOS transistor M27 may be sized larger than NMOS transistor M25 in order to reduce the internal driving current of driving logic 274. In one example, a 20:1 mirror ratio is used such that the driving logic 274 generates about 1 μA of current and current source circuit 276 produces 20 μA of current to charge and discharge the gates of transistors MSW of switch 201. In alternative embodiments, other mirror ratios and device currents may be used.

In further embodiments, other current mirror structures may be used instead of or in addition to the stacked current mirrors of current mirror 276. For example, Wilson current mirrors, Widlar current mirrors, high swing cascode current mirrors, and other structures may be used.

In some embodiments, the output of current mirror 276 has a higher output impedance during while the gates of transistors MSW are being charged than when the gates of transistors MSW are settled. During charging and discharging, output PMOS transistors M22 and M23 and NMOS transistors M26 and M27 either are turned off or operate the saturation region. When the gates of transistors MSW are fully charged output PMOS transistors M22 and M23 and NMOS transistors M26 and M27 are either turned off or biased in the linear region. In embodiments where output transistors M22 and M23 or M26 and M27 are biased in the linear region, a sufficiently high output impedance may be maintained due to the series stacking of gate-drain and gate-source capacitances of output transistors M22 and M23 or M26 and M27. A sufficiently high output impedance may be further maintained due to the current in output transistors M22 and M23 or M26 and M27 not going completely to zero due to leakage sourcing and sinking leakage currents. As such, the output impedance of the stacked transistors may be increased due to negative feedback within the stacked devices. For example, the transconductance of PMOS transistor M23 may effectively increase the output impedance of PMOS transistor M22 and the transconductance of NMOS transistor M26 may effectively increase the output impedance of NMOS transistor M27.

Figure 2E:
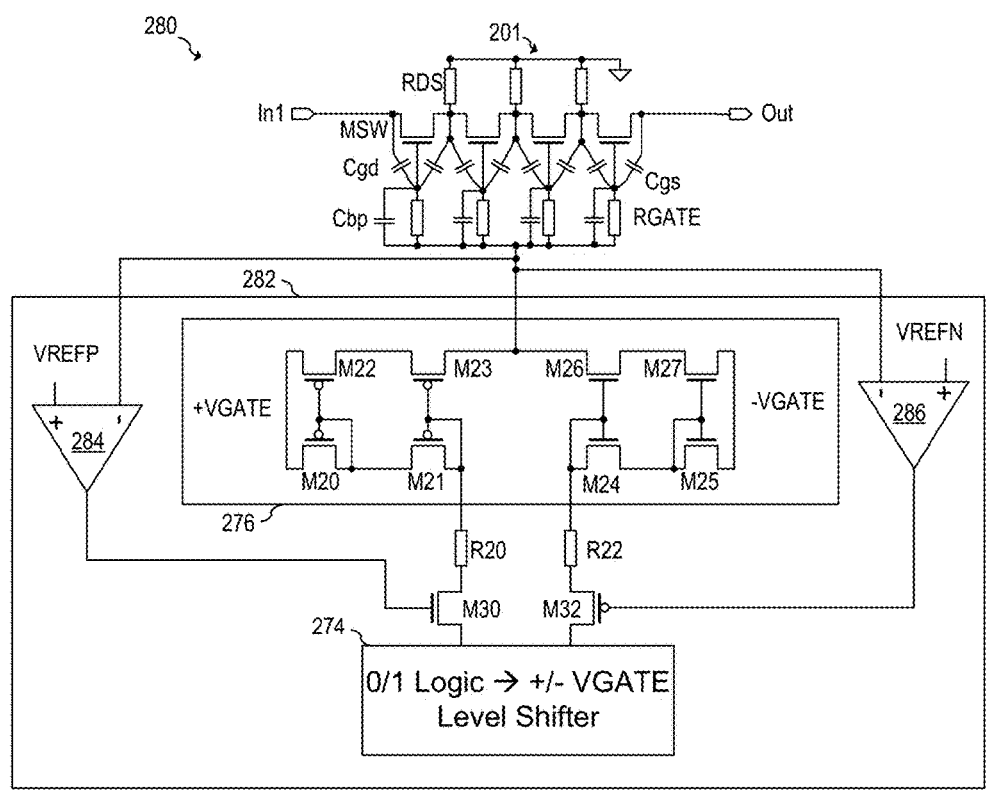

FIG. 2e illustrates an embodiment system 280 in which current source 276 is turned off when switch 201 is fully charged and or discharged. Driver 282 is similar to Driver 272 in FIG. 2d with the addition of comparators 284 and 286 and transistors M30 and M32. In an embodiment, when the output of driver 282 crosses threshold VREFP in a positive direction, the output of comparator 284 goes low, thereby shutting off transistor NMOS transistor M30 coupled between driving logic 274 and current source 276. When transistor M30 is shut off, the current flowing though current mirror transistors M20, M21, M22 and M23 is effectively shut off (with the exception of some leakage current) and creates a high impedance at the drain of PMOS transistor M23. Similarly, when the output of driver 282 crosses threshold VREFN in a negative direction, the output of comparator 286 goes high, thereby shutting off PMOS transistor M32 coupled between driving logic 274 and current source 276. When transistor M32 is shut off, the current flowing though current mirror transistors M24, M25, M26 and M27 is effectively shut off (with the exception of some leakage current) and creates a high impedance at the drain of NMOS transistor M26. In some embodiments, each transistor MSW may be assigned to an individual current source driver. In such embodiments, resistor RGATE may be omitted.

Figure 3:
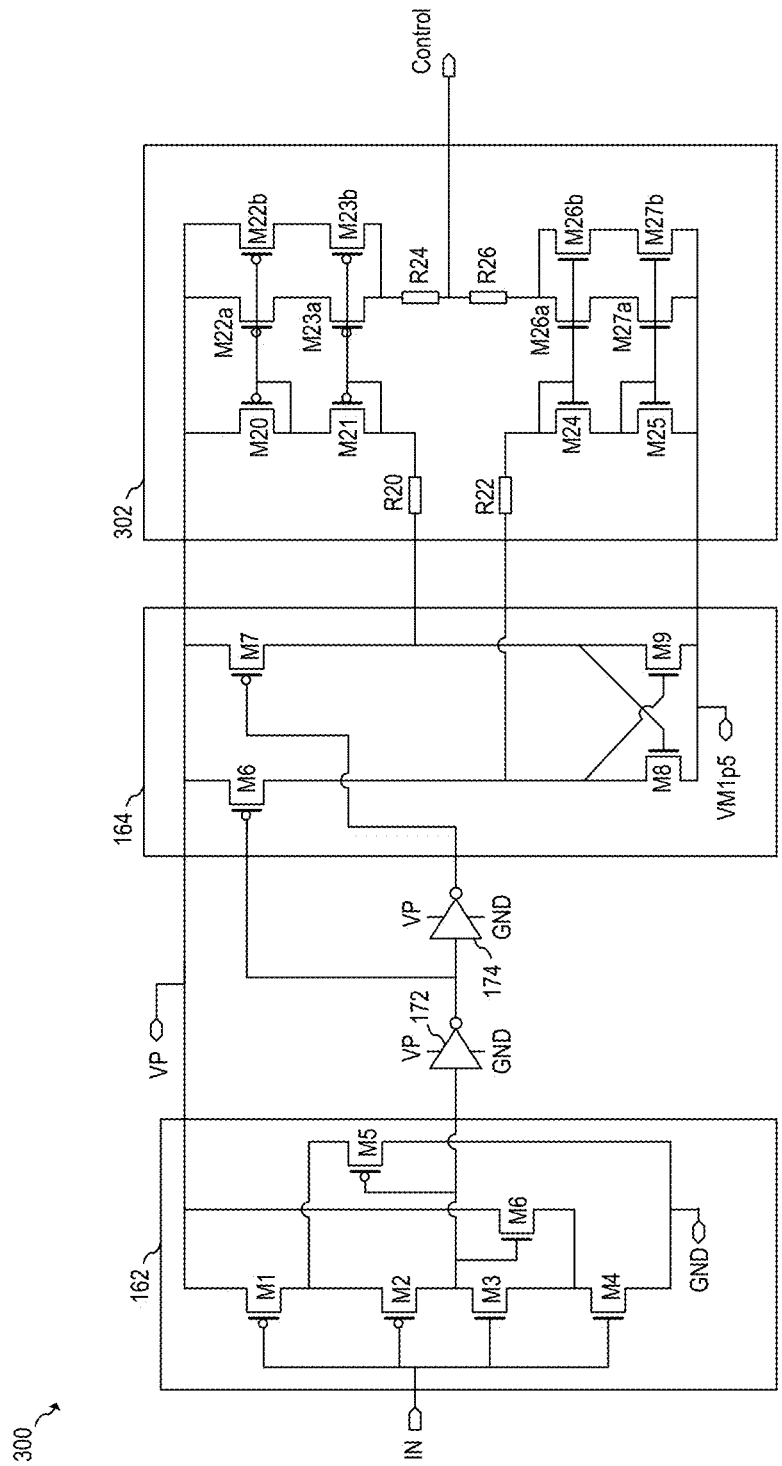
FIG. 3 illustrates an embodiment RF switch driving circuit.

FIG. 3 illustrates embodiment RF switch driver 300 that includes Schmitt trigger 162, level shifter 164 and current source output stage 302. Schmitt trigger 162 includes PMOS transistors M1 and M2 and M3 and NMOS transistors M3 M4 and M6 and level shifter 164 includes PMOS input transistors M6 and M7, NMOS transistors M8 and M9, and inverters 172 and 174. Both Schmitt trigger 162 and level shifter 164 function as described above with respect to the FIG. 1f. In some embodiments, Schmitt trigger 162 and/or level shifter 164 may be omitted.

Current source output stage 302 include a stacked PMOS current mirror that includes PMOS transistors M20, M21, M22 and M23, and a stacked NMOS current mirror that includes NMOS transistors M24, M25, M26 and M27 that function as described above with respect to the embodiment of FIG. 2d. As show, PMOS transistor M22 is represented by transistors M22a and M22b, PMOS transistor M23 is represented by transistors M23a and M23b, NMOS transistor M26 is represented by transistors M26a and M26b, and NMOS transistor M27 is represented by transistors M27a and M27b. The splitting of the output transistors represents embodiments in which multiple devices are used for the output stage of the current source to achieve particular current source ratios. In some embodiments, however, single devices may also be used for the output stages of current source 302. Resistors R20 and R22 set the input current to the PMOS and NMOS current mirrors respectively. Output resistors R24 and R26 may be included to increase the output impedance of current source output stage 302.

Figure 4:
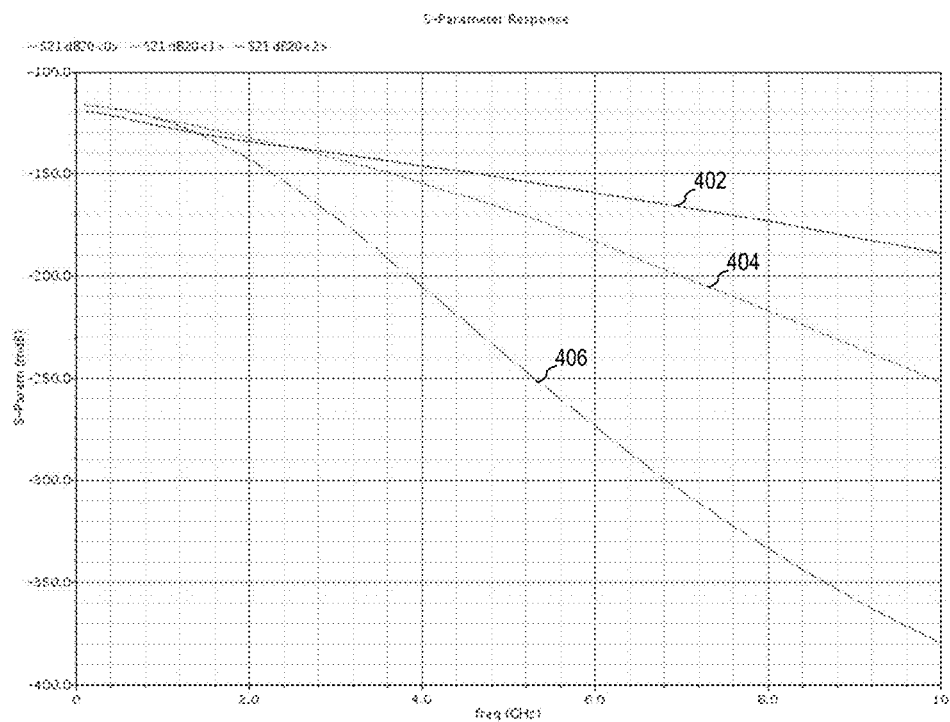
FIG. 4 illustrates a waveform diagram of the insertion loss of various RF switching circuits.

FIG. 4 illustrates a waveform diagram of a comparison of the insertion loss of embodiment and conventional RF switches. Trace 402 represents the insertion loss in mdB of a 20 transistor stacked RF switch being driven with an embodiment current-source based driver circuit, such as shown in the embodiment of FIG. 3 with 1 KΩ of resistance in series with the control node of the RF switch. Trace 404 represents the insertion loss of the 20 transistor stacked RF switch being driven with a conventional level shifter such as is shown in FIG. 1f, with an additional 10 KΩ of resistance in series with the output of the driver. Trace 406 represents insertion loss of the 20 transistor stacked RF switch being driven with a conventional level shifter such as is shown in FIG. 1f, without additional series resistance. As can be shown by FIG. 4, the RF switch driven by the embodiment driver, as represented by trace 402, has a lower insertion loss over a broad frequency range in comparison to the other systems.

Figure 5:
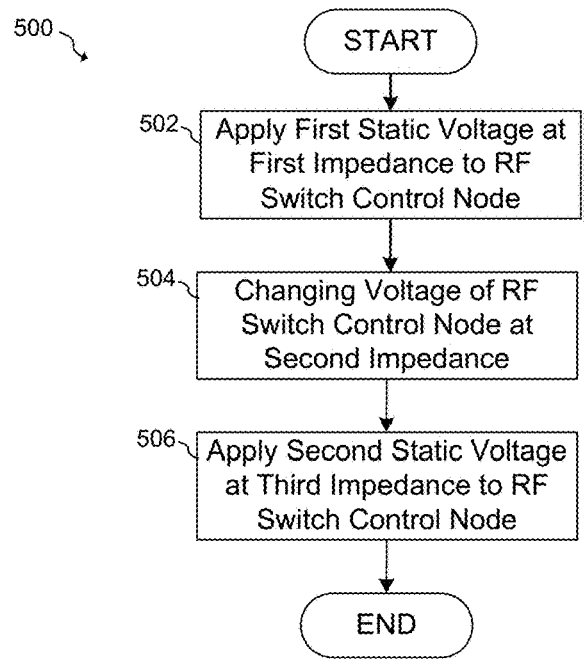
FIG. 5 illustrates a block diagram of an embodiment method.

FIG. 5 illustrates an embodiment method 500 of switching an RF switch. In step 502, a first static voltage is applied to a control node of an RF switch using a first impedance. The first static voltage may be configured to cause the RF switch to remain in an on (or conductive) state. In step 504, the voltage applied to the control node of the RF switch is changed while applying a second impedance, and in step 506, a second static voltage is applied to the control node of the RF switch. The second static voltage may be configured to cause the RF switch to remain in an off (or non-conductive state) while a third impedance is applied. In an embodiment, the first impedance and the third impedance is greater than the second impedance.

It should be understood that embodiment RF switch systems may be applied to a variety of applications. For example, SP4T RF-switch illustrated in FIGS. 1*a-c* may be implemented using embodiment RF switch driver circuits. Other applications that utilized RF switches may also be implemented using embodiment RF switch driver circuits as well.

In accordance with an embodiment, a radio frequency (RF) switching circuit includes a plurality of series connected RF switch cells having a load path and a control node, and a switch driver coupled to the control node. Each of the plurality of series connected RF switch cells includes a switch transistor and a gate resistor having a first end coupled to a gate of the switch transistor and a second end coupled to the control node. The switch driver includes a variable output impedance that varies with a voltage of the control node.

In an embodiment, the switch driver includes a first current source coupled between a first reference voltage node and the control node, and a second current source coupled between a second reference voltage node and the control node. The first current source may be implemented using a first current mirror, and the second current source may be implemented using a second current mirror. The second reference voltage node may be a ground node.

The RF switching circuit may further include a first shutoff switch coupled in series with the first current mirror, a second shutoff switch coupled in series with the second current mirror, a first comparator configured to compare the control node to a first threshold voltage and to turn off the first shutoff switch when the voltage of the control node crosses the first threshold voltage in a first direction, a second comparator configured to compare the control node to a second threshold voltage and to turn off the second shutoff switch when the voltage of the control node crosses the second threshold voltage in a second direction opposite the first direction. In an embodiment, the first shutoff switch includes a first transistor coupled in series with an input of the first current mirror, and the second shutoff switch includes a second transistor coupled in series with an input of the second current mirror. The first current mirror and the second current mirror may be implemented using stacked current mirrors.

In embodiment, the RF switching circuit further includes a level shifter circuit having an input coupled to inputs of the first current mirror and the second current mirror. The RF switching circuit may also include a Schmitt trigger having an output coupled to an input of the level shifter circuit.

In an embodiment, the switch driver includes a switchable impedance element coupled to the control node, such that the switchable impedance element includes a fixed impedance element and a bypass switch coupled in parallel with the fixed impedance element. The RF switching circuit may further include a first driver transistor coupled between a first reference voltage node and an intermediate node, and a second driver transistor coupled between a second reference voltage node and an intermediate node. The switchable impedance element is coupled between the intermediate node and the control node.

In various embodiments, the RF switching circuit may further include a control circuit configured to close the bypass switch when a voltage of the control node crosses a threshold. The RF switching circuit may also include a replica switch having a replica transistor and a replica resistor having a first end coupled to a gate of the replica transistor and a second end coupled to the switchable impedance element, and a comparator having a first input coupled to the gate of the replica transistor, a second input coupled to a threshold voltage node, and an output coupled to a control terminal of the bypass switch.

In an embodiment, switch driver includes a first variable resistance coupled between a first reference voltage node and the control node, and a second variable resistance coupled between a second reference voltage node and the control node. A first switch coupled in series with the first variable resistance, and a second switch coupled in series with the second variable resistance may also be included.

In accordance with a further embodiment, radio frequency integrated circuit (RFIC) includes a first RF switch disposed on a semiconductor substrate that has a load path coupled between a first terminal and a second terminal, and a first RF switch driver coupled to a first control node of the first RF switch. The first RF switch driver includes a first current source coupled between a first reference node and the first control node, and a second current source coupled between a second reference node and the first control node.

In an embodiment, the RFIC further includes a second RF switch disposed on the semiconductor substrate that has a load terminal coupled between the second terminal and a third terminal, and a second RF switch driver coupled to a second control node of the second RF switch. The second RF switch driver includes a third current source coupled between the first reference node and the second control node, and a fourth current source coupled between the second reference node and the second control node. The first current source may include a first current mirror, and the second current source may include a second current mirror. The first current mirror may include a first stacked current mirror, and the second current source may include a second stacked current mirror.

In an embodiment, the RFIC further includes a switching logic circuit, a first series resistor coupled between a first output of the switching logic circuit and an input of the first current mirror, and a second series resistor coupled between a second output of the switching logic circuit and an input of the second current mirror. In some embodiments, the RFIC further has a first shutoff switch coupled in series with the first resistor, a second shutoff switch coupled in series with the second resistor, a first comparator configured to compare a voltage of the first control node to a first threshold voltage and to turn off the first shutoff switch when the voltage of the first control node crosses the first threshold voltage in a first direction, a second comparator configured to compare the voltage of the first control node to a second threshold voltage and to turn off the second shutoff switch when the voltage of the first control node crosses the second threshold voltage in a second direction opposite the first direction. The first shutoff switch may be implemented using a first transistor, and the second shutoff switch may be implemented using a second transistor.

In an embodiment, the switching logic circuit includes a Schmitt trigger coupled to a level shifter that includes a first output coupled to the first output of the switching logic circuit and a second output coupled to the second output of the switching logic circuit. In some embodiments, the first RF switch includes a plurality of series connected RF switch cells having a load path and a control node. Each of the plurality of series connected RF switch cells includes a switch transistor and a gate resistor having a first end coupled to a gate of the switch transistor and a second end coupled to the control node.

In accordance with a further embodiment, a method is directed toward operating a radio frequency (RF) switching circuit having a load path and a control node. The RF switching circuit include a plurality of series connected RF switch cells, where each of the plurality of series connected RF switch cells includes a switch transistor and a gate resistor having a first end coupled to a gate of the switch transistor and a second end coupled to the control node. The method includes applying a first static voltage to the control node of the RF switching circuit at a first applied impedance, changing the voltage of the control node of the RF switching circuit form the first static voltage to a second static voltage, and applying the second static voltage to the control node of the RF switching circuit at a third applied impedance. Changing the voltage comprises charging the control node of the RF switching circuit at a second applied impedance.

In an embodiment, the steps of applying the first static voltage, changing the voltage, and applying the second static voltage includes using a first current mirror coupled between a first reference voltage and the control node, and using a second current mirror coupled between a second reference voltage and a control node. In some embodiments, the steps of applying the first static voltage and applying the second static voltage includes coupling a fixed impedance between a switchable reference voltage generator and the control node, and the step of changing the voltage comprises bypassing the fixed impedance.

The method may further include comparing a gate voltage of a replica transistor with a voltage of the control node, and determining when to bypass the fixed impedance based on the comparing. In some embodiments, the first applied impedance is greater than the second applied impedance, and the third applied impedance is greater than the second applied impedance.

Advantages of embodiments of the present invention include the reduction of RF parasitics in an RF switch, as well as the reduction in resonant effects in the connection line between RF switch and the RF switch driver. For example, the additional series resistance of embodiment switch drivers may serve to dampen low-Q resonant tanks that result from ground inductance, the bypass capacitance of resistors coupled to the switches, Cgs/Cgd of the switched transistors.

Further advantages of embodiments include a lower insertion loss, especially for high throwcount switches; lower parasitic Coff in digital capacitance tuners that use capacitors in conjunction with switch configurations. Other advantages include improved linearity, since embodiment switch driver resistance reduces the nonlinear behavior of the polysilicon resistor coupled to the gate of the switch transistors.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, embodiment switch drivers could be used to tune oscillators by switching in and out capacitors and other tuning components. Embodiment switch driver circuits may also be applied to receive/transmit switches, attenuators, power amplifier bypass circuits, RF matching, RF filter switching in general, as well as other types of circuits and systems.

What is claimed is:

1. A radio frequency integrated circuit (RFIC) comprising:
   a first RF switch disposed on a semiconductor substrate, the first RF switch having a load path coupled between a first terminal and a second terminal; and
   a first RF switch driver coupled to a first control node of the first RF switch, the first RF switch driver comprising a first current source coupled between a first reference node and the first control node and a second current source coupled between a second reference node and the first control node,
   wherein the first current source comprises a first current mirror, and the second current source comprises a second current mirror.

2. The RFIC of claim 1, further comprising:
   a second RF switch disposed on the semiconductor substrate, the second RF switch comprising a load terminal coupled between the second terminal and a third terminal; and
   a second RF switch driver coupled to a second control node of the second RF switch, the second RF switch driver comprising a third current source coupled between the first reference node and the second control node and a fourth current source coupled between the second reference node and the second control node.

3. The RFIC of claim 1, wherein the first current source and the second current source are configured to have a higher output impedance when a voltage of the first control node of the first RF switch is being charged than when the voltage of the first control node of the first RF switch is settled.

4. The RFIC of claim 1, wherein the first current mirror comprises a first stacked current mirror and the second current source comprises a second stacked current mirror.

5. The RFIC of claim 1, further comprising:
   a switching logic circuit;
   a first series resistor coupled between a first output of the switching logic circuit and an input of the first current mirror; and
   a second series resistor coupled between a second output of the switching logic circuit and an input of the second current mirror.

6. The RFIC of claim 5, further comprising:
   a first shutoff switch coupled in series with the first series resistor;
   a second shutoff switch coupled in series with the second series resistor;
   a first comparator configured to compare a voltage of the first control node to a first threshold voltage and to turn off the first shutoff switch when the voltage of the first control node crosses the first threshold voltage in a first direction; and
   a second comparator configured to compare the voltage of the first control node to a second threshold voltage and to turn off the second shutoff switch when the voltage of the first control node crosses the second threshold voltage in a second direction opposite the first direction.

7. The RFIC of claim 6, wherein:
   the first shutoff switch comprises a first transistor; and
   the second shutoff switch comprises a second transistor.

8. The RFIC of claim 5, wherein the switching logic circuit comprises a Schmitt trigger coupled to a level shifter, wherein the level shift comprises a first output coupled to the first output of the switching logic circuit and a second output coupled to the second output of the switching logic circuit.

9. The RFIC of claim 1, wherein the first RF switch comprises a plurality of series connected RF switch cells comprising a load path and a control node, wherein each of the plurality of series connected RF switch cells comprises a switch transistor and a gate resistor having a first end coupled to a gate of the switch transistor and a second end coupled to the control node.

10. A radio frequency (RF) switching circuit comprising:
an RF switch having a load path coupled between a first terminal an a second terminal;
a current source having a current output coupled to a control node of the RF switch, and a control input, the current source configured to source a first current when the control input transitions to a first state, and configured to sink a second current when the control input transitions to a second state different from the first state;
a switching logic circuit having an output coupled to the control input of the current source; and
a monitoring circuit having an input coupled to the control node of the RF switch, and an output coupled to a second control input of the current source, wherein the current source is further configured to:
reduce the first current when the monitoring circuit detects that that a voltage of the control node of the RF switch crosses a first threshold voltage, and
reduce the second current when the monitoring circuit detects that the voltage of the control node of the RF switch crosses a second threshold voltage different from the first threshold voltage.

11. The RF switching circuit of claim 10, wherein the monitoring circuit comprises:
a first comparator having a first input coupled to the control node of the RF switch, a second input having an input coupled to a node configured to provide a voltage proportional to the first threshold voltage, and a first comparator output coupled to the current source; and
a second comparator having a first input coupled to the control node of the RF switch, a second input having an input coupled to a node configured to provide a voltage proportional to the second threshold voltage, and a second comparator output coupled to the current source.

12. The RF switching circuit of claim 11, wherein the current source comprises:
a first current mirror coupled between the switching logic circuit and the control node of the RF switch;
a first switch coupled in series with the first current mirror, the first switch having a first switch control node coupled to the first comparator output;
a second current mirror coupled between the switching logic circuit and the control node of the RF switch; and
a second switch coupled in series with the second current mirror, the second switch having a second switch control node coupled to the second comparator output.

13. The RF switching circuit of claim 10, wherein the current source is further configured to have a higher output impedance when a voltage of the control node of the RF switch is being charged than when the voltage of the control node of the RF switch is settled.

14. A method of operating a radio frequency integrated circuit (RFIC) comprising a first RF switch disposed on a semiconductor substrate, the first RF switch having a load path coupled between a first terminal and a second terminal; and a first RF switch driver coupled to a first control node of the first RF switch, the first RF switch driver comprising a first current source coupled between a first reference node and the first control node and a second current source coupled between a second reference node and the first control node, the method comprising:
turning on the first RF switch, turning on the first RF switch comprising activating the first current source and deactivating the second current source;
turning off the first RF switch, turning off the first RF switch comprising activating the second current source and deactivating the first current source, and
monitoring a voltage of the first control node of the first RF switch, wherein:
turning on the first RF switch further comprises reducing a current of the first current source from a first current to a second current when a voltage of the first control node of the first RF switch crosses a first threshold voltage; and
turning off the first RF switch further comprises reducing a current of the second current source from a third current to a fourth current when a voltage of the first control node of the first RF switch crosses a second threshold voltage different from the first threshold voltage.

15. The method of claim 14, wherein the second current and the fourth current are zero.

16. The method of claim 14, wherein:
the first current source comprises a first current mirror;
the second current source comprises a second current mirror;
turning on the first RF switch comprises applying a turn-on current to the first current mirror; and
turning off the first RF switch comprises applying a turn-off current to the second current mirror.

17. The method of claim 14, further comprising providing a higher output impedance to the first control node of the first RF switch when a voltage of the first control node of the first RF switch is being charged than when the voltage of the first control node of the first RF switch is settled.

* * * * *